United States Patent
Kameda

(10) Patent No.: US 7,236,401 B2
(45) Date of Patent: Jun. 26, 2007

(54) NONVOLATILE SEMICONDUCTOR MEMORY DEVICE AND WRITE/VERIFY METHOD THEREOF

(75) Inventor: Yasushi Kameda, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 11/242,897

(22) Filed: Oct. 5, 2005

(65) Prior Publication Data

US 2006/0126386 A1    Jun. 15, 2006

(30) Foreign Application Priority Data

Oct. 6, 2004    (JP)    ............... 2004-293870

(51) Int. Cl.
*G11C 11/34*    (2006.01)
*G11C 16/06*    (2006.01)
(52) U.S. Cl. ............... 365/185.22; 365/185.17; 365/185.24; 365/185.11; 365/189.08
(58) Field of Classification Search ........... 365/185.22, 365/185.17, 185.24, 185.11, 185.33, 189.05, 365/189.08
See application file for complete search history.

(56) References Cited

U.S. PATENT DOCUMENTS 5,602,789 A * 2/1997 Endoh et al. .......... 365/185.03
5,949,714 A    9/1999 Hemink et al.
6,704,223 B2 * 3/2004 Hosono et al. ........ 365/185.09
6,798,697 B2 * 9/2004 Hosono et al. ........ 365/185.12
2004/0213045 A1 * 10/2004 Nakai ................... 365/185.13

FOREIGN PATENT DOCUMENTS

JP    8-87895    4/1996

* cited by examiner

*Primary Examiner*—Anh Phung
*Assistant Examiner*—Toan Le
(74) *Attorney, Agent, or Firm*—Oblon, Spivak, McClelland, Maier & Neustadt, P.C.

(57) ABSTRACT

A nonvolatile semiconductor memory device includes write/verify circuits, a switching elements which divides the bit lines into plural portions, and a control circuit. The control circuit is configured to control the write/verify circuits and switching elements. The control circuit performs a control operation to perform the write and verify operations with the switching elements set in an OFF state when a memory cell of an address to be written lies on the write/verify circuit side in the memory cell array, write and save data into a memory cell lying on the write/verify circuit side with the switching elements set in the OFF state when the memory cell lies farther apart from the write/verify circuit than the switching elements, and then turn ON the switching elements while the write/verify circuit is not being operated and write the saved data into a memory cell of an address to be written.

20 Claims, 6 Drawing Sheets

Save data into WL1_0 instead of selected WL1_512

NONVOLATILE SEMICONDUCTOR MEMORY DEVICE AND WRITE/VERIFY METHOD THEREOF

CROSS-REFERENCE TO RELATED APPLICATIONS

This application is based upon and claims the benefit of priority from prior Japanese Patent Application No. 2004-293870, filed Oct. 6, 2004, the entire contents of which are incorporated herein by reference.

BACKGROUND OF THE INVENTION

1. Field of the Invention

This invention relates to an electrically rewritable nonvolatile semiconductor memory device and a write/verify method thereof. More specifically, for example, this invention relates to the technique for enhancing the write/verify speed in a flash memory having large memory capacity or a system using the flash memory.

2. Description of the Related Art

The number of memory cells connected to a bit-line is increased with an increase in the memory capacity of a nonvolatile semiconductor memory device and the pitch of the bit lines is narrowed with a reduction in the chip size. Therefore, the capacitance associated with the bit line and the capacitance between the bit lines are steadily increased. The charging/discharging time of the bit line is increased by an increase in the load capacitance of the bit line and time for writing data into a memory cell becomes long. As a result, in a system using the nonvolatile semiconductor memory device, for example, in a system such as a digital camera having a NAND flash memory into which a large amount of data is written, write time will become long.

Further, in the general nonvolatile semiconductor memory device, since it is necessary to verify whether or not data is written to a sufficient extent after the data write operation, longer time is required. The operation of writing data into the NAND flash memory is performed by applying high voltage to the control gate of a cell transistor acting as a memory cell to change (shift) the threshold voltage of the cell transistor. After this, the verify operation is performed to monitor the shifting amount of the threshold voltage of the cell transistor and determine whether or not the shifting amount of the threshold voltage of the cell transistor is sufficiently large. At this time, if the write characteristic of the cell transistor varies, it becomes necessary to increase the number of write and verify operations and it becomes necessary to take further long time to perform the write/verify operation (for example, refer to Jpn. Pat. Appn. KOKAI Publication No. H08-087895).

Recently, a chance of dealing with large capacity data such as moving data, image data of high quality and the like occurs many times and it is desired to enhance the write/verify speed in a flash memory and a system using the flash memory.

BRIEF SUMMARY OF THE INVENTION

According to an aspect of the present invention, there is provided a nonvolatile semiconductor memory device comprising a memory cell array having memory cells arranged in a matrix form, write/verify circuits which are connected to one-side ends of bit lines in the memory cell array and configured to write data into the memory cell and verify the written data, a switching elements which divides the bit lines into plural portions, and a control circuit configured to control the write/verify circuit and switching elements, wherein the control circuit performs a control operation to perform write and verify operations with the switching elements set in an OFF state when a memory cell of an address to be written lies on the write/verify circuit side with respect to the switching elements, writes and saves data into a memory cell lying on the write/verify circuit side with the switching elements set in the-OFF state when the memory cell of the address to be written lies farther apart from the write/verify circuit than the switching elements, and then turns ON the switching elements while the write/verify circuit is not being operated and writes the saved data into a memory cell of an address to be written.

According to another aspect of the present invention, there is provided a write/verify method of a nonvolatile semiconductor memory device comprising determining whether or not a memory cell of an address to be written lies on the write/verify circuit side in a memory cell array, dividing bit lines into plural portions, writing data into a selected memory cell in the memory cell array and verifying the data when it is determined that the memory cell of the address to be written lies on the write/verify circuit side in the memory cell array, dividing the bit lines into plural portions, saving data into a memory cell which lies on the write/verify circuit side in the memory cell array when it is determined that the memory cell of the address to be written lies in position apart from the write/verify circuit in the memory cell array, and connecting the divided bit lines while the write/verify circuit is not being operated and writing data saved by the saving into the memory cell to be written.

According to another aspect of the present invention, there is provided a write/verify method of a nonvolatile semiconductor memory device comprising a first step of determining whether or not a memory cell of an address to be written lies on a write/verify circuit side in a memory cell array, a second step of dividing bit lines into plural portions, writing data into a selected memory cell in the memory cell array and verifying the data when it is determined in the first step that the memory cell of the address to be written lies on the write/verify circuit side in the memory cell array, a third step of dividing the bit lines into plural portions and saving data into a memory cell which lies on the write/verify circuit side in the memory cell array when it is determined in the first step that the memory cell of the address to be written lies in position apart from the write/verify circuit in the memory cell array, and a fourth step of connecting the divided bit lines while the write/verify circuit is not being operated and writing data saved in the third step into the memory cell to be written.

DETAILED DESCRIPTION OF THE INVENTION

Figure 1:
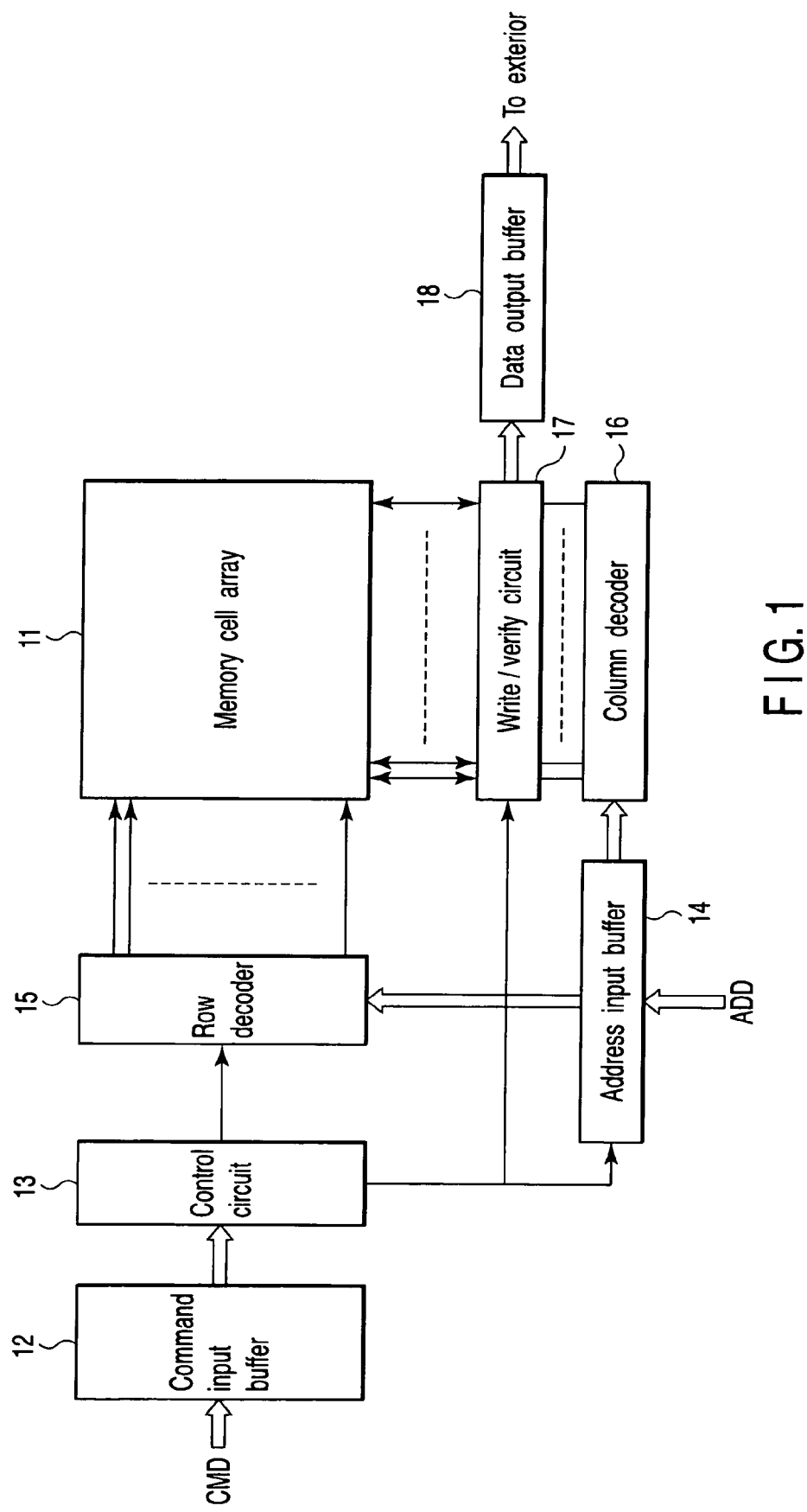
FIG. 1 is a block diagram showing the schematic configuration of a main portion relating to the write and verify operations of a NAND flash memory, for illustrating a nonvolatile semiconductor memory device according to one embodiment of this invention and a write/verify method thereof.

FIG. 1 is a block diagram showing the schematic configuration of a main portion relating to the write and verify operations of a NAND flash memory, for illustrating a nonvolatile semiconductor memory device according to one embodiment of this invention and a write/verify method thereof.

As shown in FIG. 1, the NAND flash memory includes a memory cell array 11, command input buffer 12, control circuit 13, address input buffer 14, row decoder 15, column decoder 16, write/verify circuit 17 and data output buffer 18.

When a command CMD is input to the command input buffer 12, the command is decoded by the control circuit 13 and the address input buffer 14, row decoder 15, write/verify circuit 17 and the like are controlled according to the command CMD by the control circuit 13. A row address signal among the address signal ADD input to the address input buffer 14 is supplied to and decoded by the row decoder 15 and a column address signal is supplied to and decoded by the column decoder 16. One of the memory cells (cell transistors) in the memory cell array 11 is selected by the row decoder 15 and column decoder 16. Data read out from the selected memory cell is amplified by the sense amplifier of the write/verify circuit 17 and supplied to the exterior via the data output buffer 18. Further, when data is written into the memory cell, whether data is written to a sufficient extent or not, that is, whether the shifting amount of the threshold voltage of the sell transistor is sufficiently large or not is verified by the write/verify circuit 17.

Figure 2:
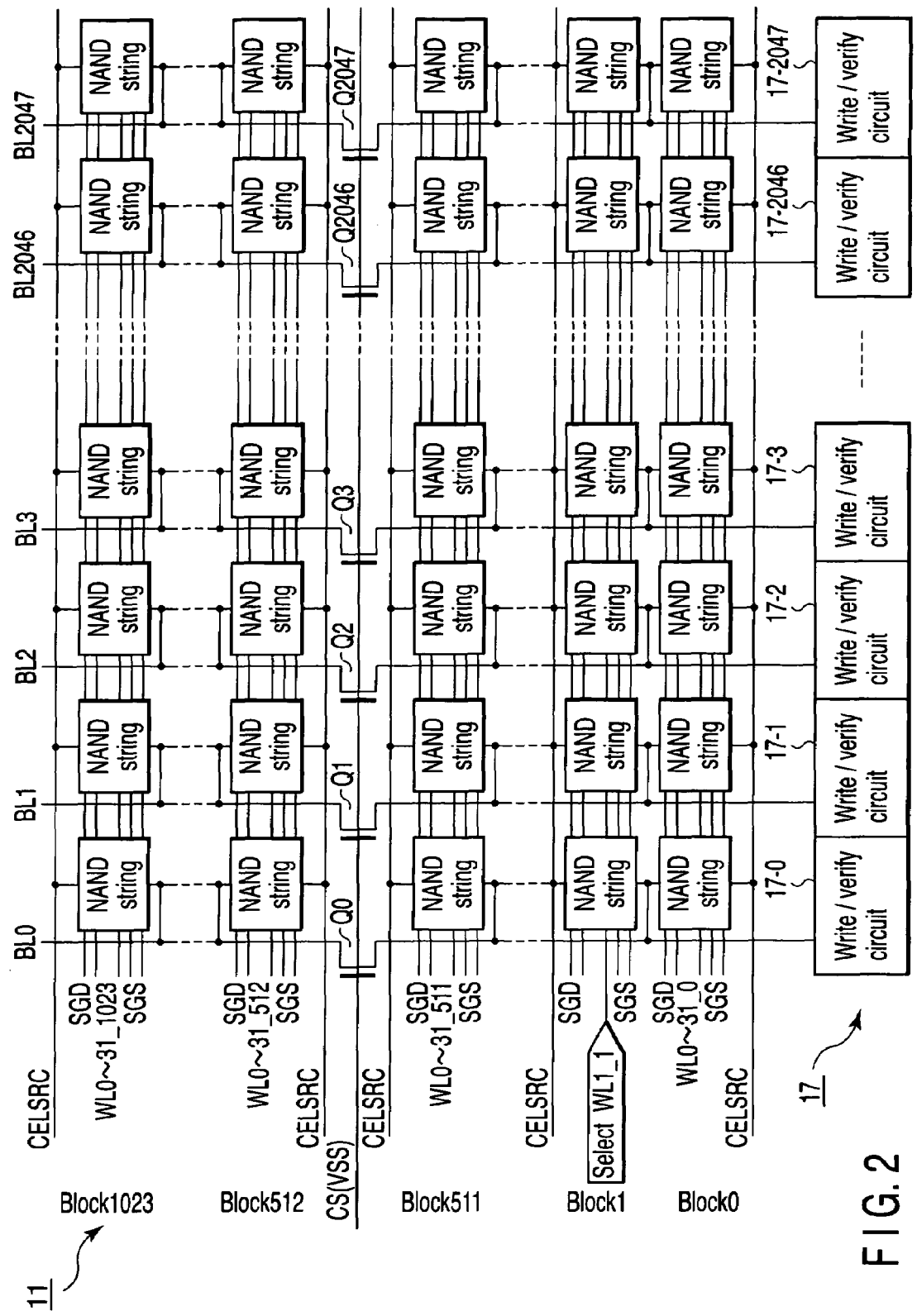
FIG. 2 is a block diagram showing an example of the configuration of a memory cell array and a write/verify circuit in the circuit shown in FIG. 1.

As shown in FIG. 2, in the memory cell array 11, NAND strings are arranged in a matrix form. The NAND strings arranged on the same row configure one block. In this example, 1024 blocks Block0 to Block1023 configure the memory cell array 11. A corresponding one of word lines WL0-31_* (* indicates 0 to 1023) and corresponding ones of selection gate lines SGD, SGS are commonly connected to the NAND strings in each of the blocks Block0 to Block1023.

Figure 3A:
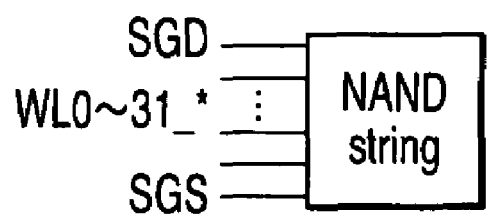
FIG. 3A is a symbol diagram showing a NAND string of FIG. 2.
Figure 3B:
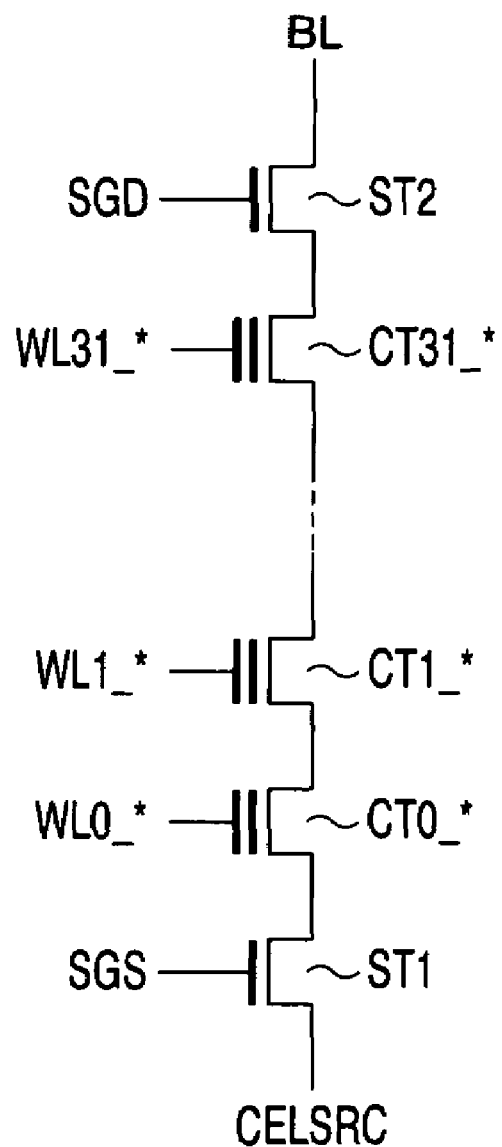
FIG. 3B is a circuit diagram showing a concrete example of the configuration of the NAND string of FIG. 2.

As shown in FIGS. 3A and 3B, an example in which the current paths of 32 cell transistors CT0_* to CT31_* are serially connected in each of the NAND strings is shown. The current path of a selection gate transistor ST1 is connected between the source of the cell transistor CT0_* and a source line CELSRC and the current path of a selection gate transistor ST2 is connected between the drain of the cell transistor CT31_* and the bit line BL. The selection transistors ST1 in the NAND strings arranged on the same row are commonly connected to a corresponding one of the selection gate lines SGS, the control gates of the cell transistors CT0_* to CT31_* are respectively connected to word lines WL0_* to WL31_* and the selection transistors ST2 are commonly connected to a corresponding one of the selection gate lines SGD.

The NAND strings arranged on the same column are commonly connected to a corresponding one of the bit lines BL0 to BL2047 for each column. In portions of the bit lines BL0 to BL2047 which lie in the central portion (between Block511 and Block512) of the memory cell array 11, the current paths of MOS transistors Q0 to Q2047 acting as switching elements which divide the bit lines BL0 to BL2047 into plural portions are connected. The gates of the MOS transistors Q0 to Q2047 are supplied with a control signal CS from the control circuit 13 and the MOS transistors are ON/OFF controlled by the control signal. When the MOS transistors Q0 to Q2047 are set in the ON state, the bit lines BL0 to BL2047 are made continuous, and if a bit line BLi (i=0 to 2047) is selected, 1024 NAND strings are connected to the selected bit line BLi. On the other hand, when the MOS transistors Q0 to Q2047 are set in the OFF state, the bit lines BL0 to BL2047 are divided into two portions and 512 NAND strings are connected to each divided portion of the selected bit line BLi. That is, the memory cell array 11 is divided into two portions of the blocks Block0 to Block511 and the blocks Block512 to Block1023 by the MOS transistors Q0 to Q2047. One-side ends of the bit lines BL0 to BL2047 are connected to write/verify circuits 17-0 to 17-2047.

Figure 4:
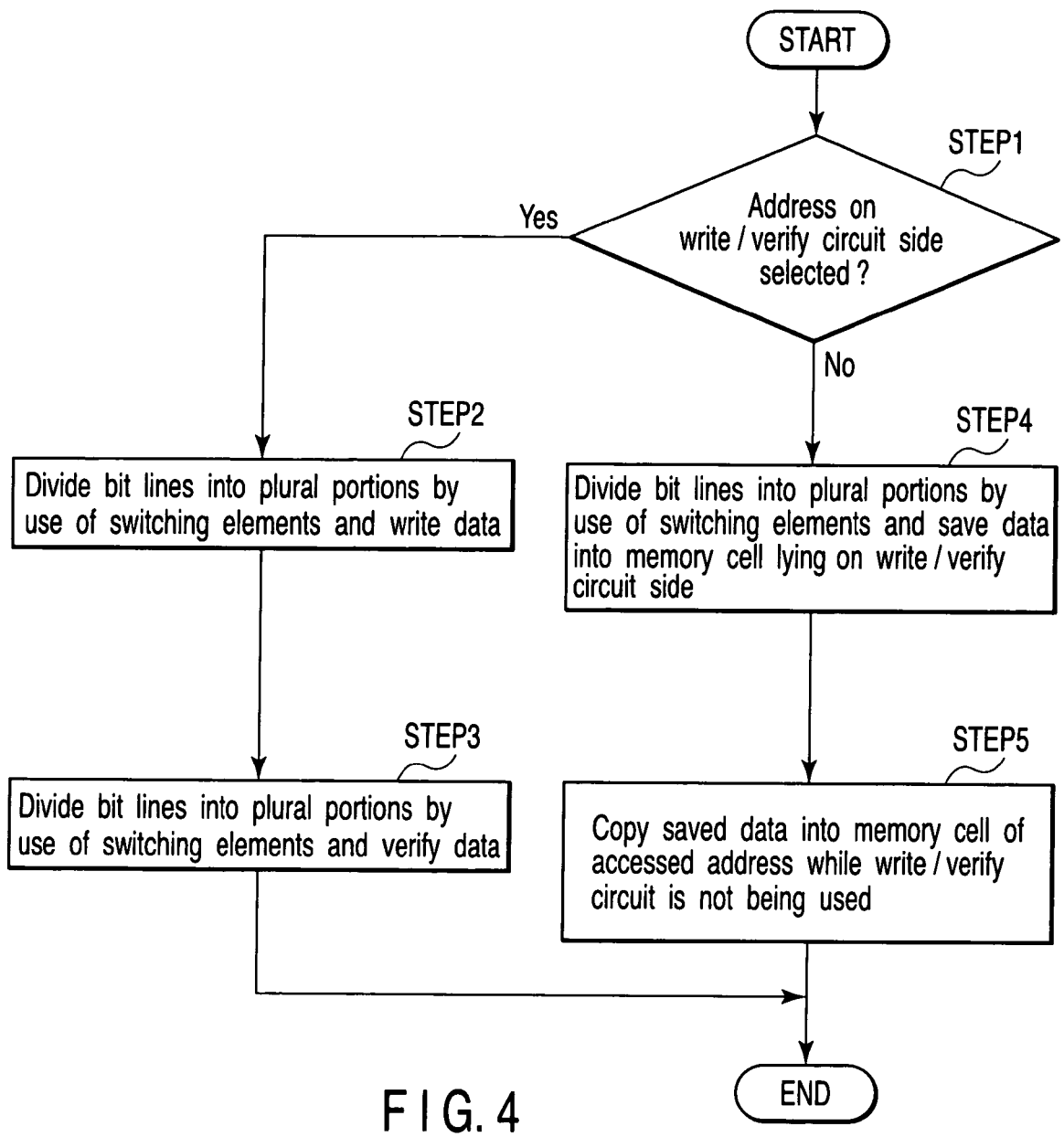
FIG. 4 is a flowchart for illustrating a write/verify method.

With the above configuration, if a command CMD is input to the command input buffer 12 to specify a write operation, whether an address to be written specifies a memory cell which lies in the blocks Block0 to Block511 or a memory cell which lies in the blocks Block512 to Block1023 is determined based on the address signal ADD input to the address input buffer 14 as shown in the flowchart of FIG. 4. In other words, whether the memory cell lies in position closer to or farther apart from the write/verify circuits 17 than the MOS transistors Q0 to Q2047 is determined (STEP1).

For example, suppose that it is determined in STEP1 that the memory cell of the address to be written lies in position close to the write/verify circuit 17 (in the block Block0 to Block511), for example, the word line WL1_1 in the block Block1 is selected as shown in FIG. 2. Then, the control signal CS is set to a ground potential VSS level to turn OFF the MOS transistors Q0 to Q2047 and divide the bit lines BL0 to BL2047 into two portions and data is written into the memory cell selected by the word line WL1_1 and verified (STEP2). In this case, since the bit line capacitance is reduced by half, the charging and discharging time of the bit line can be substantially reduced by half and time required for the writing and verifying operations can be reduced.

Figure 5:
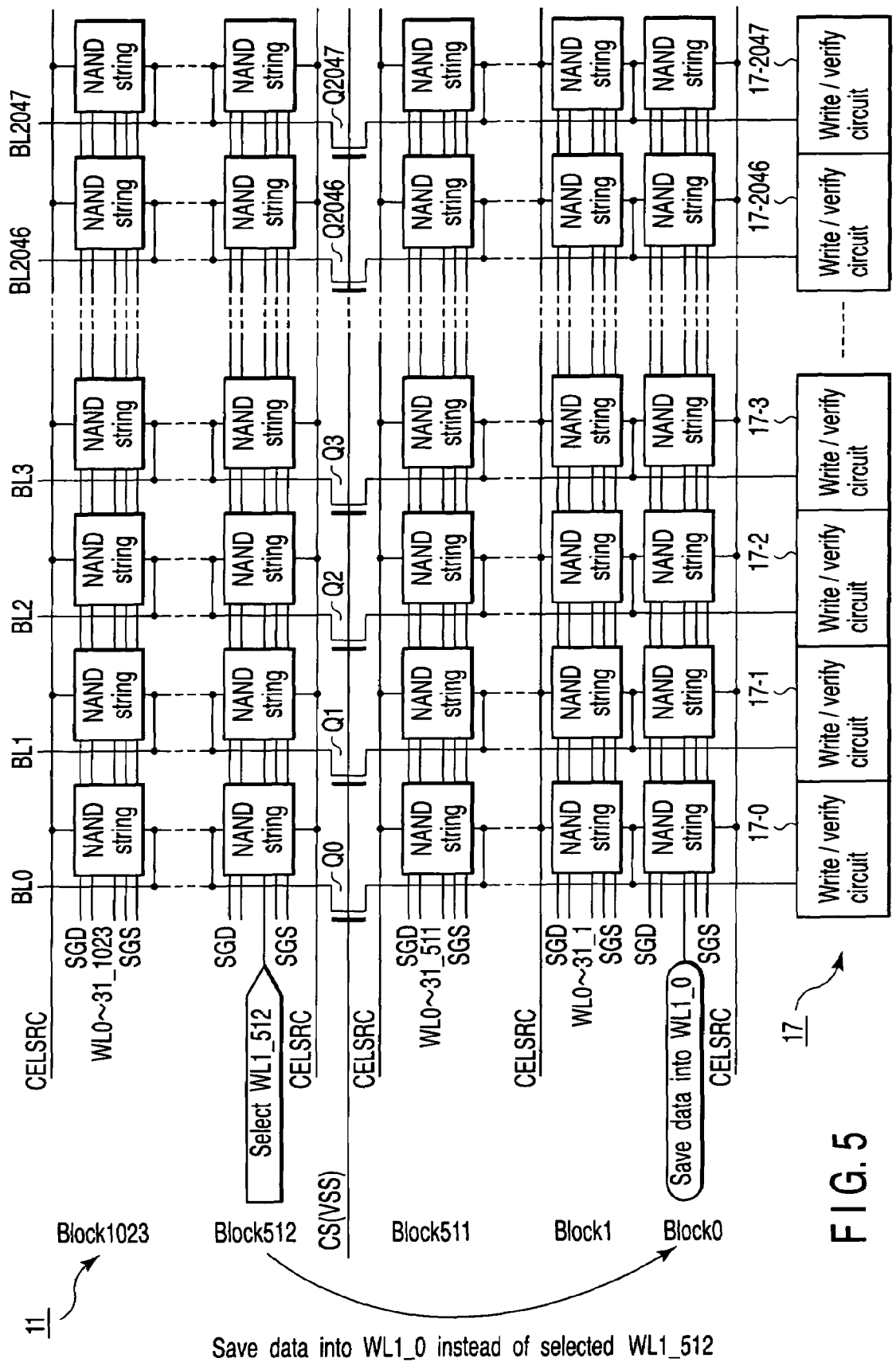
FIG. 5 is a block diagram for illustrating the write verify operation.

On the other hand, suppose that it is determined in STEP1 that the memory cell of the address to be written lies in position far apart from the write/verify circuit 17 (in the block Block512 to Block1023), for example, the word line WL1_512 in the block Block512 is selected as shown in FIG. 5. Then, the control signal CS is set to the ground potential VSS level to turn OFF the MOS transistors Q0 to Q2047 and divide the bit lines BL0 to BL2047 into two portions and data is saved into the memory cell of an address obtained by changing the most significant address of the block address (STEP3). In the case of FIG. 5, data is saved into a memory cell selected by the word line WL1_0.

In order to enhance the write operation speed, it is important to perform the save operation in the early stage (reduce the number of write operations). Therefore, it is preferable to reduce the number of write operations by performing the write operation by use of the binary write operation and raising the write voltage (even if the threshold voltage control operation of the cell transistor is sacrificed to some extent).

Figure 6:
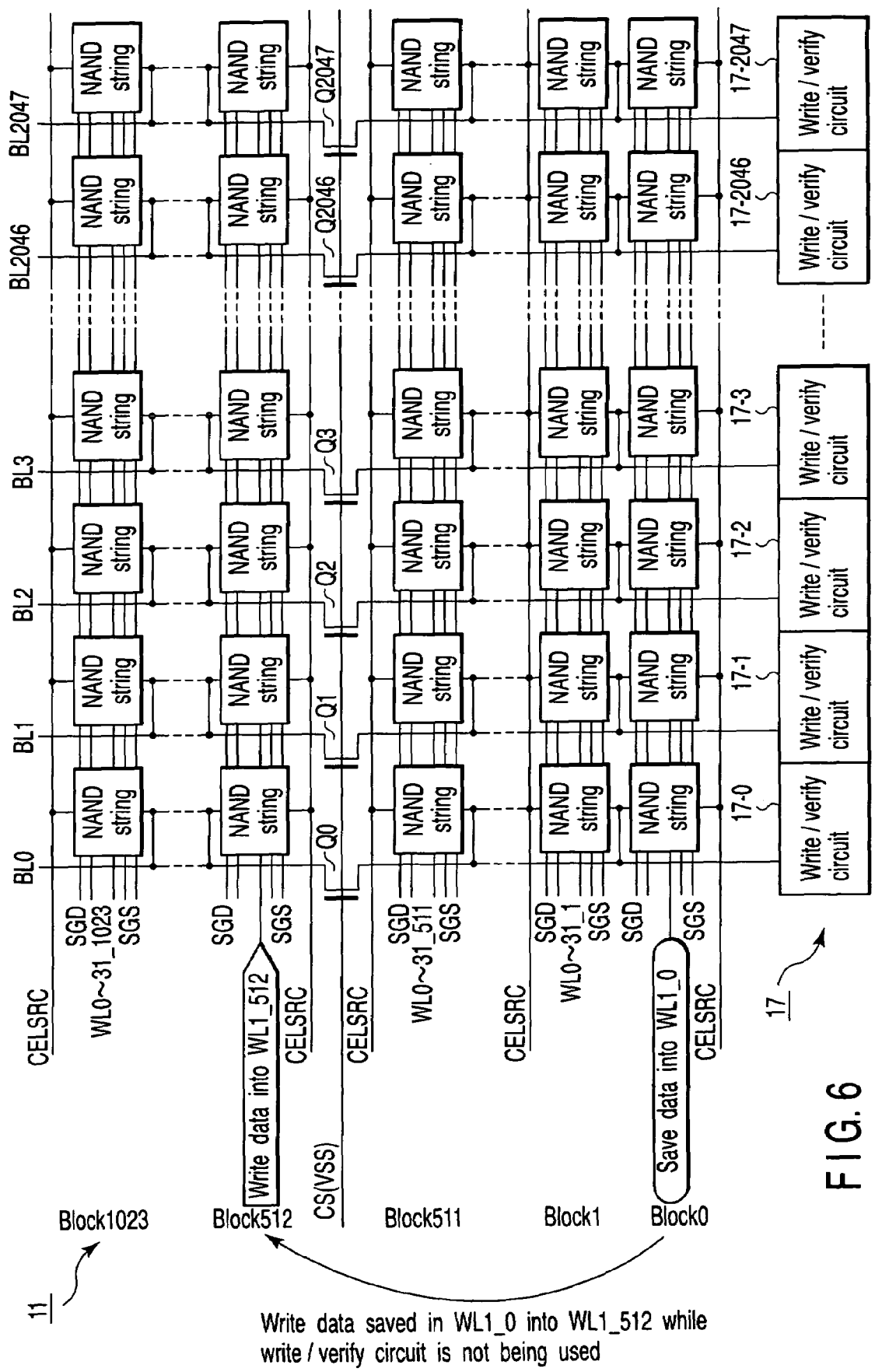
FIG. 6 is a block diagram for illustrating the write verify operation.

After this, as shown in FIG. 6, the operation of writing the saved data into a memory cell with the correct address to be written is performed in a manner such as a page copying operation by setting the control signal CS to the power supply voltage VDD level to turn ON the MOS transistors Q0 to Q2047 when the write/verify circuit 17 is not used (STEP3).

As timing at which the write operation with respect to the correct address is performed, for example, the following timings (a) to (d) are considered.

(a) Timing at which the write operation is performed into another plane:

(b) Timing at which another chip is accessed in the case of a plural-chip configuration:

(c) Input/output (serial read/data load) time:

(d) Available time of the controller:

That is, the write time for the whole portion of the system can be reduced by writing data into a correct address in available time in which the write time of the system is not limited.

In the above embodiment, a case wherein the bit lines are divided into two portions and the charging/discharging time of the bit line is halved is explained as an example. However, if the bit lines are divided into n (n is a positive integer equal to or larger than 3) portions, the charging/discharging time of the bit line can be reduced to 1/n times and the write and verify operation speeds can be enhanced.

As described above, in the nonvolatile semiconductor memory device such as the NAND flash memory having large load capacitance of the bit lines, the write and verify operation speeds can be enhanced by dividing the bit lines to reduce the bit line capacitance of the bit line and performing the write operation when a memory cell arranged in position close to the write/verify circuit is selected at the write time. On the other hand, when a memory cell arranged in position far away from the write/verify circuit is selected, data is first saved into a memory cell arranged in position close to the write/verify circuit at high speed and then the data is written (copied) into a memory cell of a correct address by operating the write/verify circuit while the write/verify circuit is not being used.

Thus, the charging/discharging time of the bit line at the write time or verify time can be shortened by reducing the load capacitance of the bit lines, saving data into a memory cell arranged in position close to the write/verify circuit and rewriting the data into a memory cell with a correct address during available time. The write and verify speed of the whole chip (system) can be enhanced by performing the operation of rewriting the data into the memory cell with the correct address during another operation (while data is being written into another address, while another chip is being operated in the case of a plural-chip configuration or while data is being input/output).

As described above, according to one aspect of this invention, a nonvolatile semiconductor memory device in which the write and verify speeds can be enhanced and a write/verify method thereof can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:

a memory cell array having memory cells arranged in a matrix form, write/verify circuits which are connected to one-side ends of bit lines in the memory cell array and configured to write data into the memory cell and verify the written data, switching elements which divide the bit lines into plural portions, and a control circuit configured to control the write/verify circuit and switching elements, the control circuit performs a control operation to perform write and verify operations with the switching elements set in an OFF state when a memory cell of an address to be written lies on the write/verify circuit side with respect to the switching elements, writes and saves data into a memory cell lying on the write/verify circuit side with the switching elements set in the OFF state when the memory cell of the address to be written lies farther apart from the write/verify circuit than the switching elements, and then turns ON the switching elements while the write/verify circuit is not being operated and writes the saved data into a memory cell of an address to be written.

2. The nonvolatile semiconductor memory device according to claim 1, wherein the memory cell array has NAND strings arranged in a matrix form.

3. The nonvolatile semiconductor memory device according to claim 2, wherein those of the NAND strings arranged in the matrix form which are arranged on the same row configure one block.

4. The nonvolatile semiconductor memory device according to claim 3, wherein the write/verify circuits are each arranged in correspondence to the NAND strings arranged on the same column among the NAND strings arranged in the matrix form.

5. The nonvolatile semiconductor memory device according to claim 4, wherein each of the write/verify circuits includes a sense amplifier.

6. The nonvolatile semiconductor memory device according to claim 1, wherein the switching elements are ON/OFF-controlled by a control signal supplied from the control circuit and the bit lines are divided into plural portions when the switching elements are set into the OFF state.

7. The nonvolatile semiconductor memory device according to claim 6, wherein the switching elements includes MOS transistors having current paths connected in the bit lines and gates supplied with the control signal.

8. The nonvolatile semiconductor memory device according to claim 1, further comprising a command input buffer to which a command is input, an address input buffer to which an address signal is input, a row decoder which decodes a row address signal supplied from the address input buffer, and a column decoder which decodes a column address signal supplied from the address input buffer.

9. The nonvolatile semiconductor memory device according to claim 8, wherein the control circuit decodes a command input to the command input buffer and controls the address input buffer, row decoder and write/verify circuits according to the command.

10. The nonvolatile semiconductor memory device according to claim 1, further comprising a data output buffer which outputs an output signal of the write/verify circuits to the exterior.

11. A write/verify method of a nonvolatile semiconductor memory device comprising:

determining whether or not a memory cell of an address to be written lies on the write/verify circuit side in a memory cell array, dividing bit lines into plural portions, writing data into a selected memory cell in the memory cell array and verifying the data when it is determined that the memory cell of the address to be written lies on the write/verify circuit side in the memory cell array, dividing the bit lines into plural portions, saving data into a memory cell which lies on the write/verify circuit side in the memory cell array when it is determined that the memory cell of the address to be written lies in position apart from the write/verify circuit in the memory cell array, and connecting the divided bit lines while the write/verify circuit is not being operated and writing data saved by the saving into the memory cell to be written.

12. The write/verify method of a nonvolatile semiconductor memory device according to claim 11, wherein an address of the memory cell in which data is saved by the saving is obtained by changing the most significant address of a block address in the memory cell of the address to be written.

13. The write/verify method of a nonvolatile semiconductor memory device according to claim 12, wherein an operation of saving data by the saving is a binary writing operation.

14. The write/verify method of a nonvolatile semiconductor memory device according to claim 13, wherein write voltage used when data is saved by the saving is set higher than write voltage used in a normal write operation.

15. The write/verify method of a nonvolatile semiconductor memory device according to claim 13, wherein time at which the write/verify circuit is not operated is one of time at which a writing operation into another plane is performed, time at which another chip is accessed in a case of a plural-chip configuration, data input/output time and available time of a controller.

16. A write/verify method of a nonvolatile semiconductor memory device comprising:
    a first step of determining whether or not a memory cell of an address to be written lies on a write/verify circuit side in a memory cell array,
    a second step of dividing bit lines into plural portions, writing data into a selected memory cell in the memory cell array and verifying the data when it is determined in the first step that the memory cell of the address to be written lies on the write/verify circuit side in the memory cell array,
    a third step of dividing the bit lines into plural portions and saving data into a memory cell which lies on the write/verify circuit side in the memory cell array when it is determined in the first step that the memory cell of the address to be written lies in position apart from the write/verify circuit in the memory cell array, and
    a fourth step of connecting the divided bit lines while the write/verify circuit is not being operated and writing data saved in the third step into the memory cell to be written.

17. The write/verify method of a nonvolatile semiconductor memory device according to claim 16, wherein an address of the memory cell in which data is saved in the third step is obtained by changing the most significant address of a block address in the memory cell of the address to be written.

18. The write/verify method of a nonvolatile semiconductor memory device according to claim 17, wherein an operation of saving data in the third step is a binary writing operation.

19. The write/verify method of a nonvolatile semiconductor memory device according to claim 18, wherein write voltage used when data is saved in the third step is set higher than write voltage used in a normal write operation.

20. The write/verify method of a nonvolatile semiconductor memory device according to claim 16, wherein the fourth step is performed at one of time at which a writing operation into another plane is performed, time at which another chip is accessed in a case of a plural-chip configuration, data input/output time and available time of a controller.

* * * * *